United States Patent
Beckhart et al.

(10) Patent No.: US 6,300,644 B1
(45) Date of Patent: Oct. 9, 2001

(54) TOOL FOR ALIGNING A ROBOT ARM TO A CASSETTE FOR HOLDING SEMICONDUCTOR WAFERS

(75) Inventors: Gordon Haggott Beckhart, Colorado Springs; Patrick Rooney Conarro, Cascade; Kevin James Harrell, Woodland Park; Michael Charles Krause; Kamran Michael Farivar-Sadri, both of Colorado Springs, all of CO (US)

(73) Assignee: MicroTool, Inc., Colorado Springs, CO (US)

( * ) Notice: Subject to any disclaimer, the term of this patent is extended or adjusted under 35 U.S.C. 154(b) by 0 days.

(21) Appl. No.: 09/346,867

(22) Filed: Jul. 2, 1999

Related U.S. Application Data

(60) Provisional application No. 60/127,895, filed on Apr. 5, 1999, and provisional application No. 60/113,020, filed on Dec. 21, 1998.

(51) Int. Cl.[7] ................................................. G01B 11/00
(52) U.S. Cl. ...................................... 250/559.33; 356/400
(58) Field of Search ........................... 250/559.29, 559.3, 250/559.33, 559.36, 559.37, 559.38, 559.4, 223 R; 356/399, 400, 401; 414/222.02, 744.6, 935, 936, 937, 938, 939, 940, 941; 118/712, 713; 700/213, 218, 228; 33/533, 645

(56) References Cited

U.S. PATENT DOCUMENTS

| | | | |
|---|---|---|---|
| 4,819,167 | 4/1989 | Cheng et al. | 364/167.01 |
| 4,955,780 | 9/1990 | Shimane et al. | 414/744.2 |
| 5,225,691 * | 7/1993 | Powers et al. | 250/559.4 |
| 5,436,721 | 7/1995 | Pence et al. | 356/154 |
| 5,438,418 | 8/1995 | Fukui et al. | 356/399 |
| 5,452,521 | 9/1995 | Niewmierzycki | 33/520 |
| 5,454,170 * | 10/1995 | Cook | 33/645 |
| 5,510,892 | 4/1996 | Mizutani et al. | 356/139.1 |
| 5,530,550 | 6/1996 | Nikoonahad et al. | 356/375 |
| 5,563,798 | 10/1996 | Berken et al. | 364/478.06 |
| 5,610,102 | 3/1997 | Gardopee et al. | 437/225 |
| 5,644,400 | 7/1997 | Mundt | 356/400 |
| 5,706,201 | 1/1998 | Andrews | 354/468.15 |
| 6,063,196 * | 5/2000 | Li et al. | 118/712 |
| 6,126,380 * | 10/2000 | Hillman | 414/744.6 |
| 6,178,361 * | 1/2001 | George et al. | 700/213 |

* cited by examiner

*Primary Examiner*—John R. Lee
(74) *Attorney, Agent, or Firm*—Dale B. Halling

(57) ABSTRACT

A tool for aligning a robot arm to a cassette for holding semiconductor wafers has a housing having a slot one position for holding a semiconductor wafer. A z-axis non-intrusive detector is attached to the housing and senses if the semiconductor wafer is aligned in the slot one position. An indicator is connected to the z-axis detector and provides a signal indicating when the semiconductor wafer is aligned in the slot one position.

20 Claims, 7 Drawing Sheets

*120*

| | 2 Uncovered 3 Uncovered | 2 Uncovered 3 Covered | 2 Covered 3 Covered | 2 Covered 3 Uncovered |
|---|---|---|---|---|
| 4 Uncovered 5 Uncovered | *122* | *124* | *126* | |
| 4 Uncovered 5 Covered | | | | |
| 4 Covered 5 Covered | | | | |
| 4 Covered 5 Uncovered | | | | |

FIG. 7

TOOL FOR ALIGNING A ROBOT ARM TO A CASSETTE FOR HOLDING SEMICONDUCTOR WAFERS

RELATED APPLICATION

The present application claims priority on provisional patent application 60/127,895 filed on Apr. 5, 1999 and on provisional patent application 60/113,020 filed on Dec. 21, 1998.

FIELD OF THE INVENTION

The present invention relates generally to the field of semiconductor wafer manufacturing and more particularly to a tool for aligning a robot arm to a cassette for holding semiconductor wafers.

BACKGROUND OF THE INVENTION

Semiconductor wafers are moved into and out of cassettes by automated handling devices (robots) as part of the semiconductor manufacturing process. The cassettes hold the wafers while other wafers are being processed. The automated handling devices require a setup procedure to properly pick up wafers and to properly set wafers in the proper position. The setup procedure typically involves visually determining proper robot positions and recording these coordinates. A number of problems can occur when automated handlers and platforms are not properly setup. In the most severe case automated handlers can break wafers. Less severe misalignments can lead to wafer scratching and yield loss. The most common misalignment leads to wafers bumping into the cassette walls and scraping off particles.

Visual or eyeball alignment does not align to a standard. In addition, eyeball alignments cannot address issues related to platform level, robot end effector level, or a dynamic path that the end effector may follow. Finally, eyeball alignments are difficult, time consuming, and inaccurate.

Thus there exists a need for a device that provides a standard robot setup procedure, is fast, easy, accurate and can address issues such as dynamic path concerns.

BRIEF DESCRIPTION OF THE DRAWINGS

FIG. 7 is a requirements chart for an x-y indicator in accordance with one embodiment of the invention;

DETAILED DESCRIPTION OF THE DRAWINGS

The invention is a tool for aligning a robot arm to a cassette for holding semiconductor wafers. The tool has a housing having a slot one position for holding a semiconductor wafer. A z-axis non-intrusive detector is attached to the housing and senses if the semiconductor wafer is aligned in the slot one position. An indicator is connected to the z-axis detector and provides a signal indicating when the semiconductor wafer is aligned in the slot one position. The z-axis detector makes sure that the semiconductor wafer does not slide along the slot one guides resulting is scratches and particles on the wafer. In one embodiment, the tool includes an x-y detector and x-y indicator. The x-y detector and indicator align the robot arm so that the wafer does not bump into the walls of the cassette.

Figure 1:
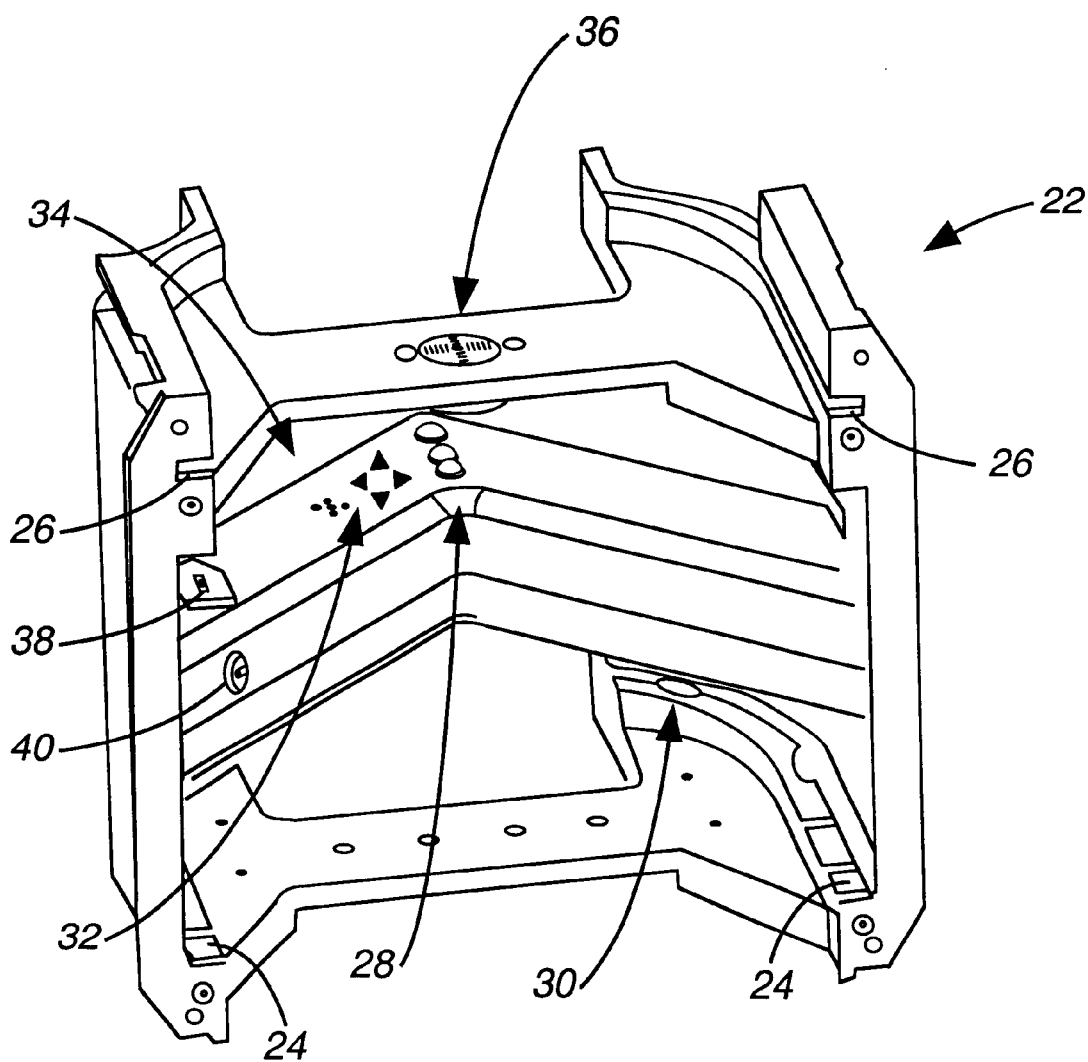
FIG. 1 is a top, left perspective view of a tool for aligning a robot arm to a cassette for holding semiconductor wafers in accordance with one embodiment of the invention.

FIG. 1 is a top, left perspective view of a tool 20 for aligning a robot arm to a cassette for holding semiconductor wafers in accordance with one embodiment of the invention. The tool 20 has a housing 22 that is similar to a semiconductor cassette. The housing 22 is made of metal in one embodiment and holds the required electronics. The housing 22 has a slot one position 24 and a slot twenty-five position 26. Once the robot has been calibrated to the slot one position 24 most robot models can then determine the other positions. Semiconductor cassettes have a standard spacing between slots, so the robot just needs to increment the z-axis to place a wafer in slot two or slot ten. Some robot models need to be calibrated to slot twenty-five in addition to slot one. The tool 20 includes a z-axis non-intrusive detector. The z-axis non-intrusive detector by SUNX model EX13B is suitable for this application. The z-axis non-intrusive detector, in one embodiment, has an optical transmitter and an optical detector aligned on the slot one position 24. When the semiconductor wafer is in the correct slot one position it breaks (reflects) the optical transmitter beam. This is detected by the optical detector. A z-axis indicator 28 indicates that the wafer is in the correct position. The z-axis indicator 28 is shown as an LED. In one embodiment the z-axis indicator has three LEDs, one for slot one, one for a lift position and one for slot twenty-five. The LEDs light (signal) when the semiconductor wafer is in the correct position. Some robots need to be calibrated to a lift position, which is the position the robot lifts from slot one to remove a semiconductor wafer from slot one. This requires a lift z-axis non-intrusive detector that is attached to the housing. The lift z-axis detector functions similarly to the slot one z-axis detector.

The housing 22 also contains an x-y detector system, one of the detectors 30 for the slot one position is shown. The x-y detector system will be described in more detail in conjunction with FIG. 5. In one embodiment, there is an x-y detector system for slot twenty-five 26. The x-y detector system is connected to an x-y indicator 32. The x-y indicator 32 includes four directional lights and a center light the turns on when the semiconductor wafer is correctly aligned along both an xaxis and a y-axis. A speaker 34 also makes an audible sound when the wafer is aligned along the z-axis.

Generally the first step in the alignment process is to replace a cassette with the tool 20. The operator checks to determine that the tool is level using the level 36. In one embodiment, the level is a bubble level. The operator turns on the tool 20 by flipping on a switch 38. The tool operates on rechargeable batteries and has an electrical jack 40 for recharging the batteries. The operator then manually moves the robot's arm that holds a semiconductor wafer into the slot one position. The x-y indicator points the direction that the semiconductor wafer needs to move. In one embodiment, the tool includes a communication link back to the robot and provides automatic feedback. This allows the robot to be calibrated (aligned) without a human operator. The z-axis indicator tells the operator when the wafer is in the correct vertical position. Once the wafer is properly aligned the robot memorizes the position. In one embodiment, the process is repeated for the lift position and slot twenty-five position. Note that the tool 20 is also used to check whether a previously aligned robot has become misaligned. Thus the tool provides a quick, accurate system for the setup and checking of robot arms in semiconductor manufacturing operations.

Figure 2:
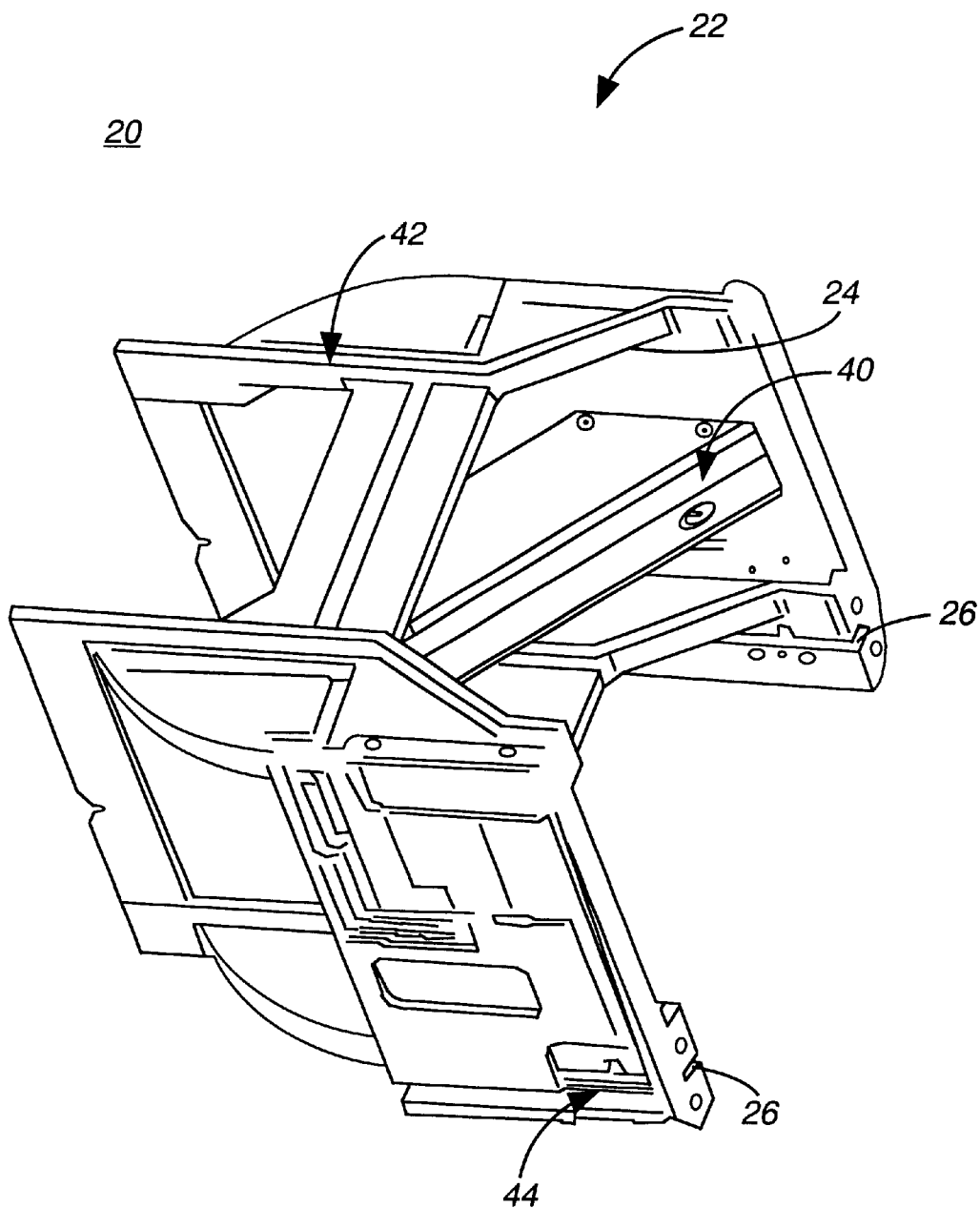
FIG. 2 is a ninety degree rotation, bottom, right perspective view of the tool of FIG. 1.

FIG. 2 is a ninety degree rotation, bottom, right perspective view of the tool 20 of FIG. 1. The tool housing 22 conforms to the SEMI (Semiconductor Equipment and Materials International) H-bar profile 42. SEMI is an international semiconductor equipment standards body. SEMI has propagated several standards for semiconductor cassettes. The housing 22 of the tool 20 conforms as much as possible to these standards. This allows the tool 20 to fit where ever a cassette can fit. The z-axis sensors 44 are adjustable.

Figure 3:
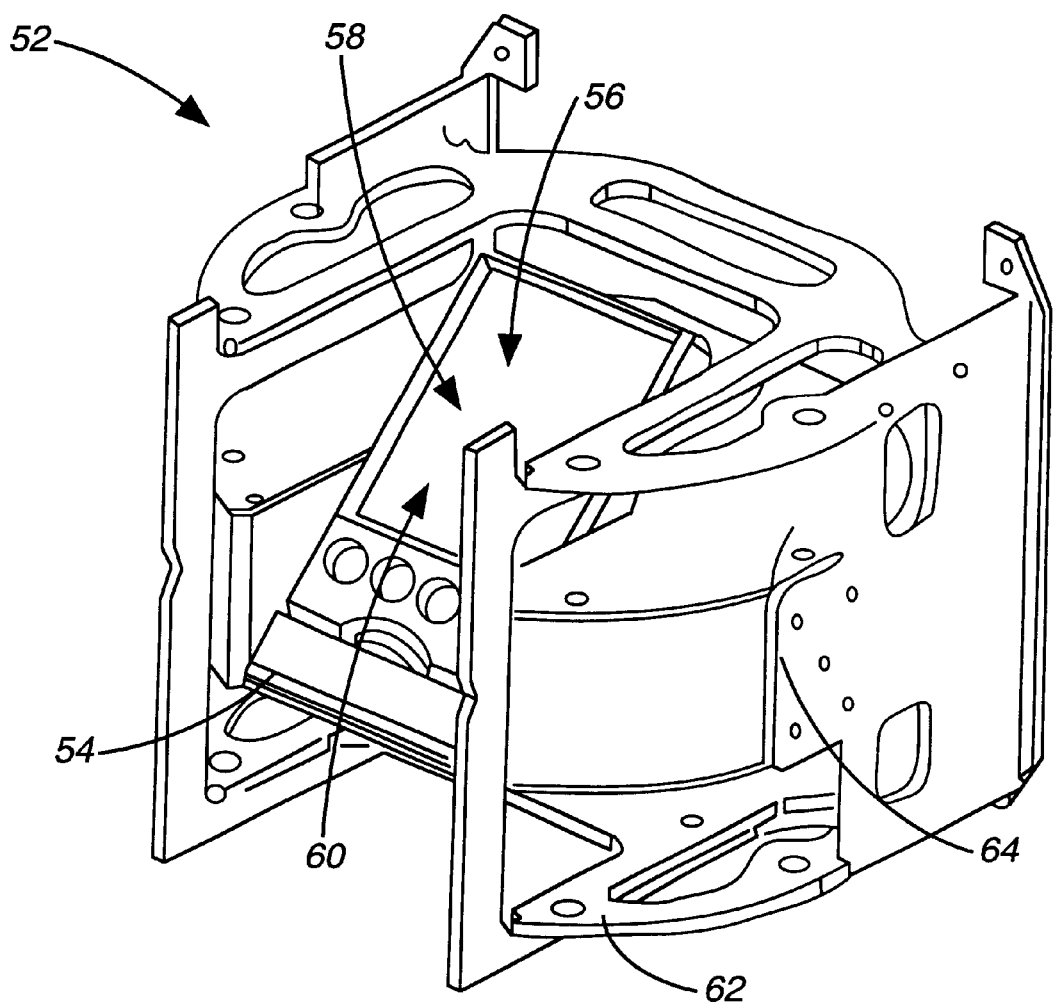
FIG. 3 is a top, right perspective view of a tool for aligning robot arm to a cassette for holding semiconductor wafers in accordance with one embodiment of the invention.

FIG. 3 is a top, right perspective view of a tool 50 for aligning a robot arm to a cassette for holding semiconductor wafers in accordance with one embodiment of the invention. The housing 52 of the tool 50 has a slot 54 for holding a handheld computer 56. The handheld computer 56 has a display 58 for z-axis, x-axis rotation and y-axis rotation. A display 60 shows the x-axis and y-axis alignment. The handheld computer provides the operator with more flexibility and power. Like the tool 20 in FIGS. 1 & 2 the housing has a slot one position 62 and a slot twenty-five position 64. The tool 50 includes x-y axis sensors and z-axis sensors. In addition, the z-axis sensors (z-axis sensor system) are able to detect tilt in the wafer. The sensor systems will be described in more detail with respect to FIGS. 5 & 8–10. In one embodiment, the sensor information is processed and commands are sent to the robot to automatically align the robot. In one embodiment the commands are sent over a wire. In another embodiment, a wireless communication connection (transmission system) is used to send the commands.

Figure 4:
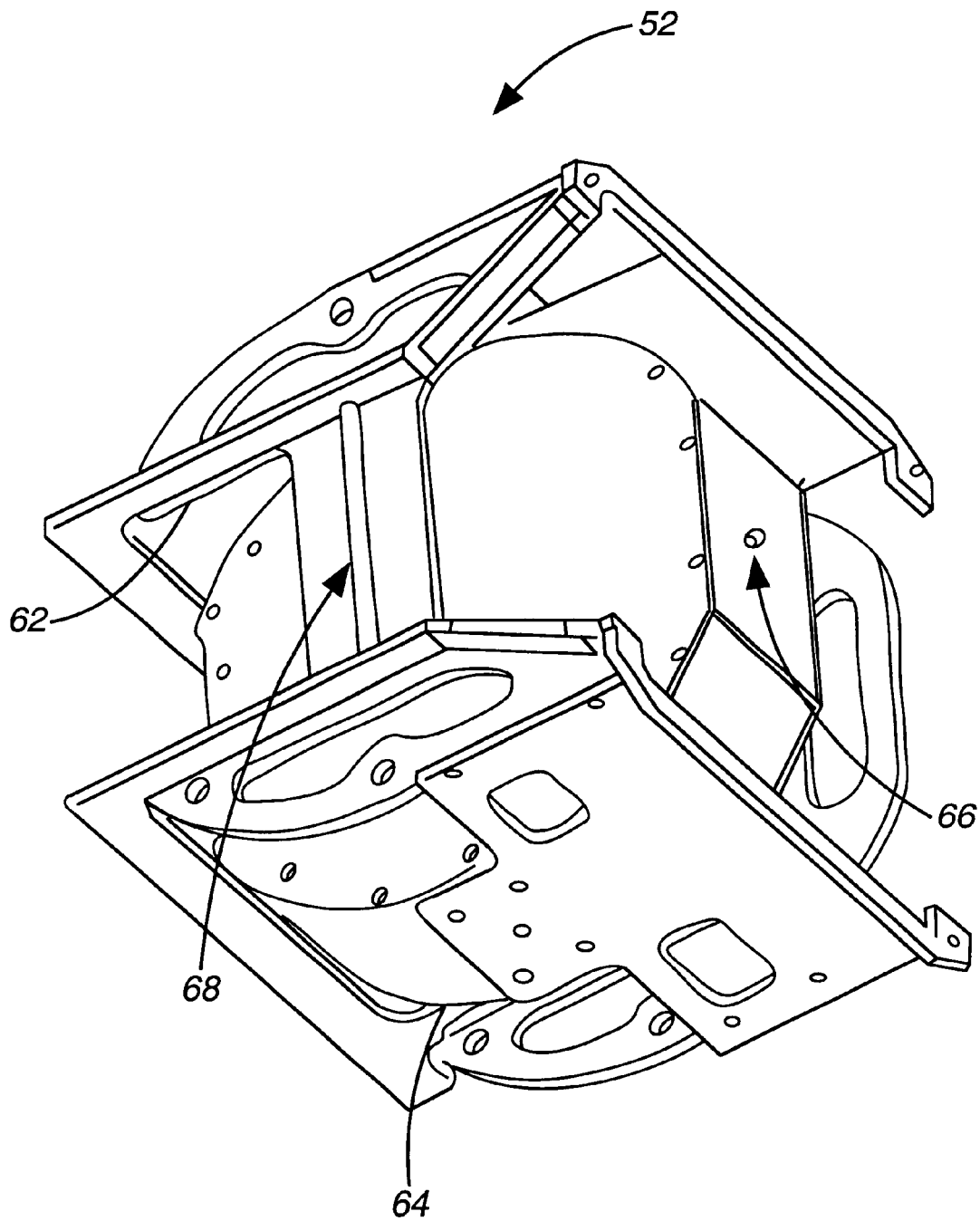
FIG. 4 is a bottom right perspective view of the tool of FIG. 3.

FIG. 4 is a bottom right perspective view of the tool 50 of FIG. 3. This view shows the charging jack 66 for the batteries and the SEMI H-bar standard design 68. The housing design is determined by the need to fit within the spaces used by the semiconductor cassettes and the need to house the sensors and the handheld computer. As will be apparent to those skilled in the art many housing designs are possible.

Figure 5:
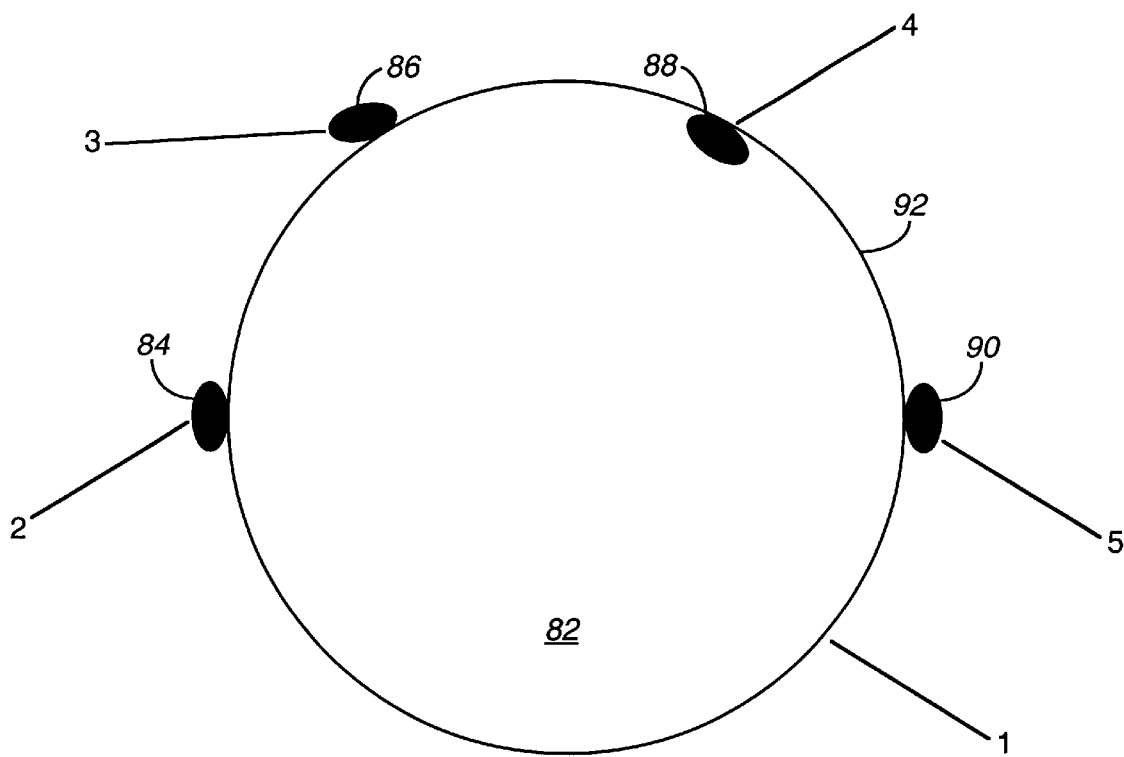
FIG. 5 is a schematic diagram of an x-y axis semiconductor wafer detection system in accordance with one embodiment of the invention.

FIG. 5 is a schematic diagram of an x-y axis semiconductor wafer detection system in accordance with one embodiment of the invention. The semiconductor wafer (1) 82 is shown in conjunction with four x-y sensors (plurality of sensors) (2) 84, (3) 86, (4) 88, (5) 90. In one embodiment, the sensors 84, 86, 88, 90 transmit an optical signal and receive a reflection when the wafer 82 covers the sensor. The detectors (2) 84, (3) 86, (5) 90 are designed to be just outside the perimeter (ideal edge position) 92 of the wafer 82 when the wafer is properly aligned. The detector (4) 88 is designed to be covered when the wafer is properly aligned. Using this information the detection system is capable of determining which direction the wafer needs to move in order to be properly aligned along the x-axis and y-axis. The logical requirements for determining the direction are shown in FIG. 7.

Figure 6:
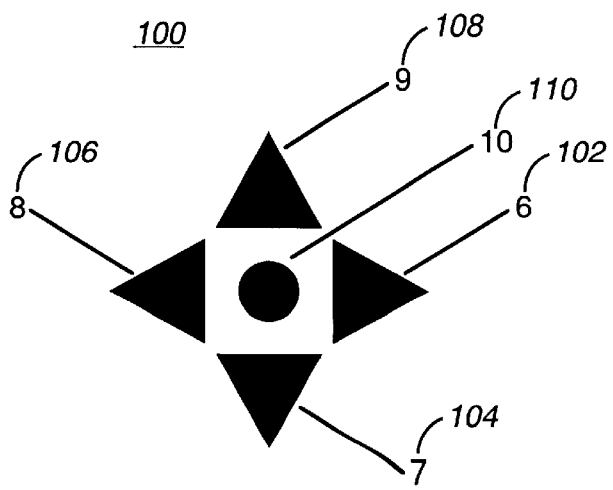
FIG. 6 is a schematic diagram of an x-y axis indicator in accordance with one embodiment of the invention.

FIG. 6 is a schematic diagram of an x-y axis indicator 100 in accordance with one embodiment of the invention. The x-y indicator 100 can be formed by using lights or can be displayed on a monitor or a screen. For clarity it will be assumed in the following discussion that the x-y indicator is formed of five lights (plurality of lights) (6), 102, (7) 104, (8) 106, (9) 108, (10) 110. The center light 110 is on when the semiconductor wafer is properly aligned (ideal position). The other lights 102, 104, 106, 108 form a pointing system indicating that the wafer needs to move in a direction. The x-y axis indicator system 100 receives a plurality of signals from the plurality of sensors of FIG. 5.

FIG. 7 is a requirements chart 120 for an x-y indicator in accordance with one embodiment of the invention. Box 122 shows that the forward light is on when all the sensors are uncovered. Box 124 shows that the right and back light are on when only sensor 3 is covered. Box 126 shows that the back and right light are on when sensors 2 & 3 are covered and sensor 4 & 5 are uncovered. The chart shows every possible combination of sensors being covered. As will be apparent to those skilled in the art a simple logic circuit is used to connect the sensors to the lights to achieve the requirements shown in the chart 120.

Figure 8:
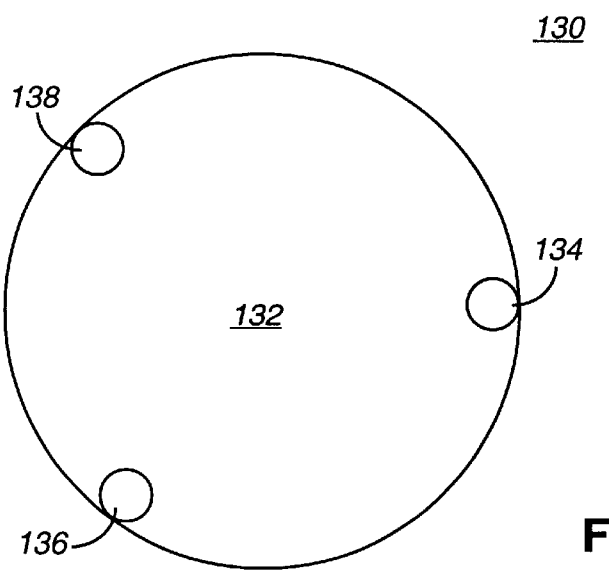
FIG. 8 is a top view z-axis detector system in accordance with one embodiment of the invention.

FIG. 8 is a top view z-axis detector system 130 in accordance with one embodiment of the invention. A semiconductor wafer 132 is shown with three z-axis detectors (plurality of distance sensors) 134, 136, 138. The z-axis detectors 134, 136, 138 each determine a distance to wafer. The z-axis detectors are made by SUNZ model FX11A in one embodiment.

Figure 9:
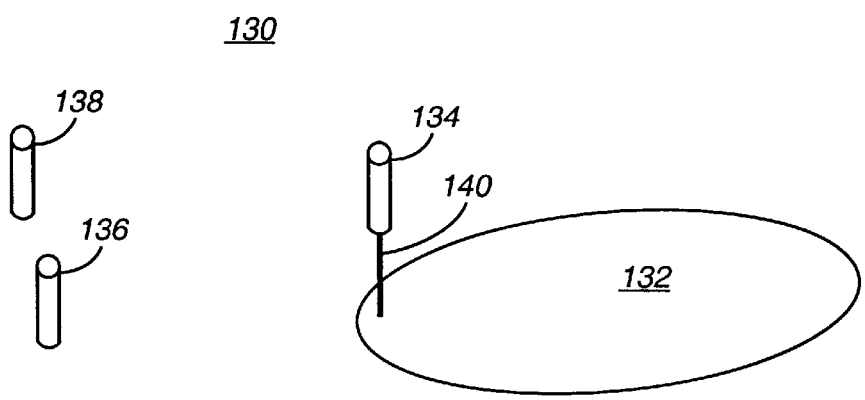
FIG. 9 is a perspective view of a z-axis detector system in accordance with one embodiment of the invention.

FIG. 9 is a perspective view of a z-axis detector system 130 in accordance with one embodiment of the invention.

Figure 10:
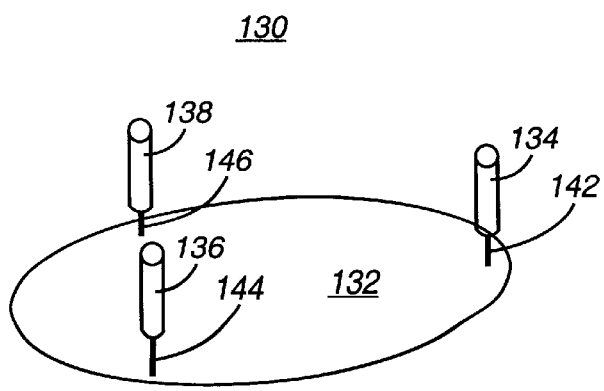
FIG. 10 is a perspective view of a z-axis detector system in accordance with one embodiment of the invention.

FIG. 10 is a perspective view of a z-axis detector system in accordance with one embodiment of the invention. As the wafer 132 enters the tool, a first measurement 140 is made. Once the wafer 132 is completely inserted into the tool a second measurement 142, third measurement 144 and a fourth measurement 146 are taken. An x-axis rotation (angular tilt) is determined by a first process that determines the difference between measurement 140 and measurement 142 and dividing by the horizontal distance of the wafer between the measurements 140, 142. An alarm can be set for the maximum amount of droop (x-axis rotation). When the maximum droop is exceeded an alarm will be triggered. A y-axis rotation is determined by a second process that determines the difference between the measurements (at least two measurements) 144, 146 and dividing by the distance between the measurements 144, 146. The operator generally adjusts the robot's arm until there is no y-axis rotation. Once the wafer is fully inserted the x-axis rotation is adjusted so that the x-axis rotation indicated by the comparison between measurement 142 and the average of the measurements 144, 146 is equal to the x-axis rotation initially measured by measurements 140, 142. The z-axis height is the average of the measurements 142, 144, 146 once the rotational adjustments have been made. Thus the z-axis detection system is capable of determining x and y axis rotation and z-axis height. This allows the tool to align rotation and adjust (detect) for excessive droop as the robot arm is in motion.

Thus there has been described a tool for aligning a robot arm to a cassette for holding semiconductor wafers that is capable of accurately aligning a robot arm. The tool is also considerably faster that the visual inspection method. Measurements indicate that it is 75% faster than the visual alignment method. The tool can be used for both setup and checking alignment.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A tool for aligning a robot arm to a cassette for holding semiconductor wafers, comprising:
   a housing having a slot one position for holding a semiconductor wafer;
   a z-axis non-intrusive detector attached to the housing, sensing if the semiconductor wafer is aligned in the slot one position; and
   an indicator connected to the z-axis detector and providing a signal indicating when the semiconductor wafer is aligned in the slot one position.

2. The tool of claim 1, further including a lift z-axis non-intrusive detector attached to the housing.

3. The tool of claim 1, further including an x-y detector system attached to the housing and determining when the semiconductor is aligned on both an x-axis and a y-axis.

4. The tool of claim, 3 further including an x-y indicator connected to the x-y detector.

5. The tool of claim 4, wherein the x-y indicator includes a pointing system that indicates a direction the semiconductor wafer needs to move to be aligned on both the x-axis and the y-axis.

6. The tool of claim 5, wherein the x-y indicator is a plurality of lights.

7. The tool of claim 1, wherein the z-axis non-intrusive detector includes an optical transmitter and an optical detector aligned on the slot one position.

8. The tool of claim 1, wherein the z-axis non-intrusive detector includes a plurality of distance sensors.

9. The tool of claim 8, further including a first process that uses at least two measurements from the plurality of distance sensors to determine an angular tilt along an x-axis.

10. The tool of claim 8, further including a second process that uses at least two measurements from the plurality of distance sensors to determine an angular tilt along a y-axis.

11. A tool for aligning a robot arm to a cassette for holding semiconductor wafers, comprising:
    a housing having a slot one position for holding a semiconductor wafer;
    an x-y axis sensor system attached to the housing and sensing an x-y position of the semiconductor wafer in the slot one position; and
    an x-y axis indicator system attached to the housing and connected to the x-y axis sensor system.

12. The tool of claim 11, wherein the x-y axis sensor system includes a plurality of sensors adjacent to an ideal edge position of the semiconductor wafer.

13. The tool of claim 12, wherein the x-y axis indicator system receives a plurality of signals from the plurality of sensors and determines a direction the semiconductor wafer needs to move to be aligned with an ideal position.

14. The tool of claim 13, wherein the x-y axis indicator system includes a plurality of lights that point the direction to the ideal position.

15. The tool of claim 14, further including a z-axis sensor system attached to the housing.

16. The tool of claim 15, further including a z-axis indicator system connected to the z-axis sensor system.

17. A tool for aligning a robot arm to a cassette for holding semiconductor wafers, comprising:
    a housing having a slot one position for holding a semiconductor wafer;
    a z-axis detection system attached to the housing, sensing if the semiconductor wafer is aligned in the slot one position; and
    an x-y detection system attached to the housing, sensing if the semiconductor wafer is x-y aligned in the slot one position.

18. The tool of claim 17 further including a transmission system capable of transmitting a signal to a robot.

19. The tool of claim 17, wherein the z-axis detection system has at least three distance sensors.

20. The tool of claim 19, wherein the z-axis detection system can determine a z-height, an x-axis rotation and a y-axis rotation.

* * * * *